(12) United States Patent
Van Wieringen

(10) Patent No.: US 10,444,277 B2
(45) Date of Patent: Oct. 15, 2019

(54) CALCULATION OF THE PROBABILITY OF GRADIENT COIL AMPLIFIER FAILURE USING ENVIRONMENT DATA

(71) Applicant: KONINKLIJKE PHILIPS N.V., Eindhoven (NL)

(72) Inventor: Arjan Teodor Van Wieringen, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 26 days.

(21) Appl. No.: 15/108,337

(22) PCT Filed: Dec. 23, 2014

(86) PCT No.: PCT/EP2014/079167
§ 371 (c)(1),
(2) Date: Jun. 27, 2016

(87) PCT Pub. No.: WO2015/101556
PCT Pub. Date: Jul. 9, 2015

(65) Prior Publication Data
US 2016/0327606 A1    Nov. 10, 2016

(30) Foreign Application Priority Data

Jan. 3, 2014    (EP) .................................... 14150124

(51) Int. Cl.
*G01R 31/28*    (2006.01)
*G01R 33/385*    (2006.01)
(Continued)

(52) U.S. Cl.
CPC ........... *G01R 31/28* (2013.01); *G01R 33/385* (2013.01); *G01R 33/3852* (2013.01); *G06F 3/01* (2013.01); *G06N 3/0472* (2013.01); *G06N 3/08* (2013.01)

(58) Field of Classification Search
None
See application file for complete search history.

(56) References Cited

U.S. PATENT DOCUMENTS 5,066,914 A    11/1991 Vavrek
5,113,145 A *    5/1992 Ideler .................... H03F 3/2171
330/207 A
(Continued)

FOREIGN PATENT DOCUMENTS

CN    102520274 A    6/2012
JP    2009011476 A    1/2009

*Primary Examiner* — Gregory J Toatley, Jr.
*Assistant Examiner* — Brandon J Becker

(57) ABSTRACT

The invention provides for a medical instrument (100, 300, 500) comprising a processor. Execution of machine executable instructions (120, 122, 124, 350, 352, 354) cause the processor to repeatedly: construct (200, 416) a measurement vector (114, 700) comprising multiple data values (704) using a measurement database (116, 122), wherein the multiple data values comprise examination room data (332) descriptive of the environmental conditions of an examination room (322) of a magnetic resonance imaging system, wherein the multiple data values further comprise technical room data (330) descriptive of the environmental conditions of a technical room (326) of the magnetic resonance imaging system; and calculate (202, 418) a probability (706) of failure of a gradient coil amplifier (312) of the magnetic resonance imaging system a predetermined number of days in the future by inputting the measurement vector into a trained neural network program (124).

14 Claims, 8 Drawing Sheets

(51) Int. Cl.
 *G06N 3/08* (2006.01)
 *G06F 3/01* (2006.01)
 *G06N 3/04* (2006.01)

(56) References Cited

U.S. PATENT DOCUMENTS

| | | | |
|---|---|---|---|
| 5,182,465 A | 1/1993 | Stanley | |
| 6,000,685 A * | 12/1999 | Groten | B01D 47/08 |
| | | | 261/106 |
| 6,004,267 A * | 12/1999 | Tewari | A61B 5/06 |
| | | | 600/300 |
| 6,121,619 A | 9/2000 | Johnsen | |
| 6,434,285 B1 | 8/2002 | Blake et al. | |
| 6,909,977 B2 | 6/2005 | Orton | |
| 7,103,509 B2 | 5/2006 | Shah et al. | |
| 7,112,319 B2 * | 9/2006 | Broderick | A61B 5/14542 |
| | | | 424/1.11 |
| 7,464,063 B2 * | 12/2008 | Vatchkov | G05B 23/021 |
| | | | 706/45 |
| 8,373,417 B2 | 2/2013 | Nerreter | |
| 8,373,471 B2 | 2/2013 | Kim | |
| 8,600,685 B2 | 12/2013 | Kalgren | |
| 2003/0088532 A1 * | 5/2003 | Hampshire, II | G06K 9/6262 |
| | | | 706/16 |
| 2003/0215125 A1 * | 11/2003 | Yokoi | G16H 40/40 |
| | | | 382/131 |
| 2004/0210417 A1 * | 10/2004 | Zakrzewski | G06N 3/08 |
| | | | 702/181 |
| 2008/0097943 A1 * | 4/2008 | Kelly | G06N 3/08 |
| | | | 706/21 |
| 2008/0100292 A1 * | 5/2008 | Hancu | G01R 33/10 |
| | | | 324/307 |
| 2010/0260293 A1 * | 10/2010 | Roeven | G01R 33/3621 |
| | | | 375/340 |
| 2011/0051785 A1 | 3/2011 | Kenington | |
| 2013/0009641 A1 * | 1/2013 | Hori | G01R 33/3852 |
| | | | 324/309 |
| 2013/0043871 A1 | 2/2013 | Lee | |
| 2013/0282635 A1 * | 10/2013 | Dull | G06N 3/0445 |
| | | | 706/25 |
| 2014/0125333 A1 * | 5/2014 | Hanada | G01R 33/56518 |
| | | | 324/307 |

* cited by examiner

FIG. 7

| Time | x1 | x2 | ... | xn | U |
|---|---|---|---|---|---|
| 0 | 123 | 3 | ... | 43 | 0 |
| 1 | 2 | 35 | ... | 3 | 0.2 |
| 2 | 52 | 2 | ... | 3 | 0.3 |
| 3 | 3 | 1 | ... | 2 | 0.9 |
| ... | ... | ... | ... | ... | ... |
| ... | ... | ... | ... | ... | ... |
| n | ... | ... | ... | ... | ... |

702 → Time column
704 → x1, x2, ..., xn columns
706 → U column
700 → table

FIG. 8

| Time | X1(0) | X1(-1) | X1(-2) | X1(-3) | ... |
|---|---|---|---|---|---|
| 0 | 123 | 0 | 0 | 0 | ... |
| 1 | 2 | 123 | 0 | 0 | ... |
| 2 | 52 | 2 | 123 | 0 | ... |
| 3 | 3 | 52 | 52 | 123 | ... |
| ... | ... | 3 | 3 | 52 | ... |
| ... | ... | ... | ... | 3 | ... |
| n | ... | ... | ... | ... | ... |

CALCULATION OF THE PROBABILITY OF GRADIENT COIL AMPLIFIER FAILURE USING ENVIRONMENT DATA

CROSS REFERENCE TO RELATED APPLICATIONS

This application is a U.S. national phase application of International Application No. PCT/EP2014/079167, filed on Dec. 23, 2014, which claims the benefit of EP Application Serial No. 14150124.7 filed on Jan. 3, 2014 and is incorporated herein by reference.

TECHNICAL FIELD OF THE INVENTION

The invention relates to magnetic resonance imaging systems, in particular the invention relates to calculating the probability that gradient coil amplifier failure will occur.

BACKGROUND OF THE INVENTION

Gradient amplifiers in an MRI are solid state and extremely complex components. Due to these characteristics they experience random failure behavior. In other words, it is impossible to predict the failure of a component based on wear-out information. The main disadvantage is that due to the random failure behavior the failures always come as a surprise and will cause significant downtime due to travel time of the service engineer, diagnostics, ordering of parts and the actual replacement of the part.

U.S. Pat. No. 8,373,417 discloses a cable monitoring device and method to detect the failure in at least one gradient coil of a magnetic resonance imaging system. U.S. Patent Application Publication No. 2003/0215125 concerns an MRI apparatus which stores automatically measured maintenance and performance data. By analyzing trend data, degradation of the MRI apparatus is recognized. In the known MRI apparatus temperature data of each part are measured.

SUMMARY OF THE INVENTION

The invention provides for a medical instrument, a computer program product and a method in the independent claims. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins by the antenna of a Magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer.

In one aspect the invention provides for a medical instrument comprising a memory for storing machine-executable instructions. The medical instrument further comprises a processor for executing the machine-executable instructions. The processor may control the operation of the medical instrument in some examples. Execution of the machine-executable instructions causes the processor to repeatedly construct a measurement vector comprising multiple data values using a measurement database. A measurement vector as used herein encompasses a data structure with multiple data values. The data values may be data of the same type or of different types. The multiple data values comprise examination room data descriptive of the environmental conditions of an examination room of a magnetic resonance imaging system. The multiple data values further comprise technical room data descriptive of the environmental conditions of a technical room of the magnetic resonance imaging system.

An examination room as used herein encompasses a room which the main magnet of the magnetic resonance imaging system is placed into. Typically in the examination room a patient is examined using a magnetic resonance imaging system. A technical room as used herein encompasses a room adjoining a magnetic resonance examination room. The technical room may contain apparatuses or equipment which is used to supply power to or control other components of a magnetic resonance imaging system. Execution of the instructions further cause the processor to repeatedly calculate a probability of failure of a gradient coil amplifier of the magnetic resonance imaging system a predetermined number of days in the future by inputting the measurement vector into a trained neural network program. The measurement vector is used as input to a previously trained neural network program. In some other embodiments the neural network program is trained.

This embodiment may be beneficial because the failure of the gradient coil amplifier is predicted at least partially using the environmental conditions of the examination room and the technical room. This may result in reduced operating costs for the medical instrument or magnetic resonance imaging system because failures of the gradient coil amplifier may require service personnel to travel there and fix it and/or to replace the gradient coil amplifier during which time the magnetic resonance imaging system cannot be used. The use of the environmental conditions of the examination room and the technical room is beneficial because it enables the prediction of a failure of the gradient coil amplifier a predetermined number of days in advance and is non-obvious.

In another embodiment the medical instrument further comprises the magnetic resonance imaging system. The components of the magnetic resonance imaging system may be in a control room in some examples, some components may be within the examination room and some components may be within the technical room. The technical room contains the gradient coil amplifier. The examination room comprises a main magnet of the magnetic resonance imaging system. The technical room comprises a first set of environmental sensors for measuring the technical room data. The examination room further comprises a second set of environmental sensors for measuring the examination room data.

Execution of the instructions further causes the processor to repeatedly acquire the technical room data using the first set of environmental sensors. Execution of the instructions further causes the processor to repeatedly record the technical room data in the measurement database. Execution of the instructions further cause the processor to repeatedly acquire the examination room data using the second set of environmental sensors. Execution of the instructions further causes the processor to repeatedly record the examination room data in the measurement database. The measurement vector is constructed using data stored in the measurement database. Repeatedly acquiring and storing the environmental sensor data for both the examination room and the technical room enables the measurement vector to be constructed using current data. This may enable more accurate prediction of the probability of the failure of the gradient coil amplifier.

In another embodiment execution of the instructions further cause the processor to train the trained neural network using the measurement database and/or historical gradient coil amplifier failure database. Using a historical record of when gradient coil amplifiers have failed measurement vectors can be constructed from the historical data. This may be used to train the neural network using standard neural network techniques and/or software tools. For instance software for implementing neural network systems is available off the shelf. Using the measurement database and/or a historical gradient coil amplifier failure database enables the use of known software tools to construct the trained neural network program.

In another embodiment execution of the instructions further causes the processor to store scanned parameter data in the measurement database. Scanned parameter data as used herein is descriptive of the usage of the gradient coil amplifier during acquisition of the magnetic resonance data. The scanned parameter data may for instance be data derived from a so called pulse sequence which describes the usage of the gradient coil amplifier during the acquisition of magnetic resonance data. The measurement vector further comprises the scanned parameter data.

In another embodiment the scanned parameter data comprises any one of the following: the number of gradient coil amplifier switching operations, the total scan time, the average RMS current per scan, the peak RMS current per scan, the scan protocol or pulse sequence used, and combinations thereof. This embodiment may be beneficial because any of these parameters may comprise data which is useful to compare with the environmental data from the examination room and/or the technical room data when determining if a failure of the gradient coil amplifier will occur.

In another embodiment execution of the instructions causes the processor to construct the measurement vector for a predetermined measurement period. The predetermined measurement period may be a predetermined period of time over which the measurement vector is constructed.

In another embodiment at least one of the multiple data values is descriptive of a measurement value for a specific measurement period different than the predetermined measurement period. Execution of the instructions causes the processor to construct the at least one multiple data value by calculating a weighted average. This embodiment may be beneficial because the various data values in the database may be acquired on different timescales. For instance the environmental data from either the examination room or the technical room may be acquired at a relatively low rate, say one time per day or several times per day. Other data such as data regarding the scanned parameters may be acquired many times per hour. For instance the total scan time may change from hour to hour and the average RMS current per scan or other parameters may continuously be varying at a very high frequency in comparison to other data measurements. By constructing a weighted average data which bears different timescales may be constructed into a single measurement vector.

In another embodiment execution of the instructions further causes the processor to construct at least one of the multiple data values by retrieving previous data from the measurement database for a time period that occurred before the specific measurement period. This embodiment may be beneficial because it enables the inclusion of data at several different time periods. For instance the temperature in the technical room may be critical in determining when a failure of the gradient coil amplifier will occur. However, the temperature may not just be dependent upon one time period but also the temperature in several preceding time periods. This embodiment enables the inclusion of data from other time periods for analysis by the trained neural network.

In another embodiment execution of the instructions further causes the processor to repeatedly record failed scan data in the measurement database. Failed scanned data is descriptive of one or more occurrences of a failed magnetic resonance image scan by the magnetic resonance imaging system. The measurement vector further comprises the failed scan data. For instance the measurement vector may record how many times the magnetic resonance imaging system failed to make a magnetic resonance imaging scan when controlled to.

In another embodiment execution of the instructions further cause the processor to repeatedly record gradient coil amplifier crash data in the measurement database. The gradient coil amplifier crash data is descriptive of one or more occurrences of the gradient coil amplifier crash by the gradient coil amplifier. The measurement vector further comprises the gradient coil amplifier crash data. For instance the measurement in the measurement vector may comprise the number of gradient coil amplifier crashes during the predetermined time period.

In another embodiment the examination room data comprises any one of the following: examination room temperature, examination room humidity, and combinations thereof.

In another embodiment the technical room data comprises any one of the following: technical room temperature, technical room humidity, gradient coil amplifier coolant temperature, gradient coil amplifier coolant pressure, gradient coil amplifier coolant flow rate, and combinations thereof.

In another embodiment the predetermined number of days is one day.

In another embodiment the predetermined number of days is two days.

In another embodiment the predetermined number of days is three days.

In another embodiment the predetermined number of days is four days.

In another embodiment the predetermined number of days is five days.

In another embodiment the predetermined number of days is six days.

In another embodiment the predetermined number of days is seven days.

In another embodiment the predetermined number of days is greater than three days.

In another embodiment the predetermined number of days is greater than four days.

In another embodiment the predetermined number of days is greater than five days.

In another embodiment the predetermined number of days is greater than six days.

In another embodiment the predetermined number of days is greater than seven days.

In another aspect the invention provides for a computer program product comprising machine-executable instructions for execution by a processor controlling a medical instrument. Execution of the machine-executable instructions causes the processor to repeatedly construct a measurement vector comprising multiple data values using a measurement database. The multiple data values comprise examination room data descriptive of the environmental conditions of an examination room of a magnetic resonance imaging system. The multiple data values further comprise technical room data descriptive of the environmental conditions of a technical room of the magnetic resonance imaging system. Execution of the instructions further cause the processor to repeatedly calculate a probability of failure of a gradient coil amplifier of the magnetic resonance imaging system a predetermined number of days in the future by inputting the measurement vector into a trained neural network program.

In another aspect the invention provides for a method of operating a medical instrument. The method comprises the steps of repeatedly constructing a measurement vector comprising multiple data values using a measurement database. The multiple data values comprise examination room data descriptive of the environmental conditions of an examination room of a magnetic resonance imaging system. The multiple data values further comprise technical room data descriptive of the environmental conditions of a technical room of the magnetic resonance imaging system. The method further comprises the step of repeatedly calculating a probability of failure of a gradient coil amplifier of the magnetic resonance imaging system a predetermined number of days in the future by inputting the measurement vector into a trained neural network program.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which:

FIG. 7 shows a table containing measurement vectors;

FIG. 8 shows a further table containing measurement vectors;

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
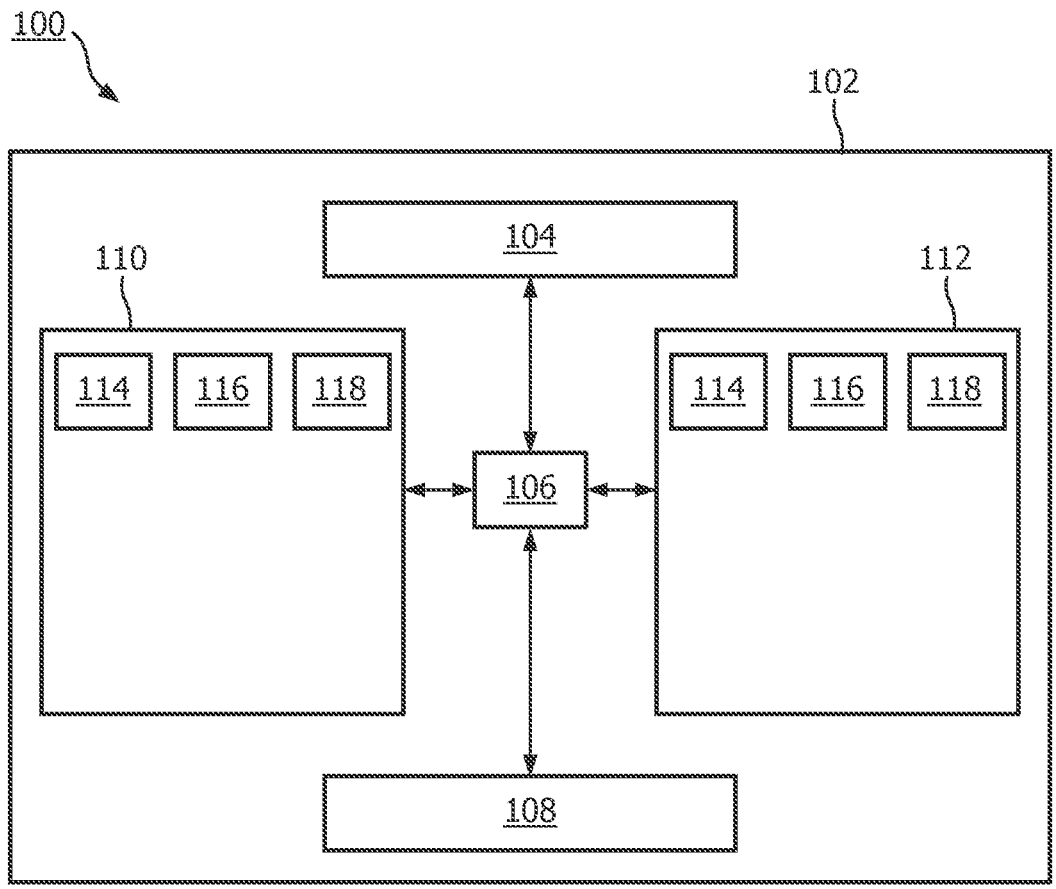
FIG. 1 shows an example of a medical instrument.

FIG. 1 shows an example of a medical instrument 100. The medical instrument 100 comprises a computer 102. The computer is shown as having an optional hardware interface 104 that enables a processor 106 of the computer 102 to control other instruments and devices. The computer 102 is additionally shown as containing a user interface 108, computer storage 110, and computer memory 112. The contents of the computer storage 110 and the computer memory 112 may duplicate each other or the contents of either may be switched between the storage 110 and the memory 112.

The processor 106 is shown as being in communication with the hardware interface 104, the user interface 108, the computer storage 110 and the computer memory 112.

The computer storage 110 is shown as containing a measurement vector 114. The computer storage 110 is further shown as containing a measurement database 116. The measurement database 116 may for instance be a relational database, or it may be a simpler type of database such as a data file or even a table or comma separated value file containing data which may be extracted and used to construct the measurement vector 114. The computer storage 110 is further shown as containing a probability 118 that was calculated using the measurement vector 114.

The computer memory 112 is shown as containing a control module 120. The control module 120 enables the processor 106 to control and operate the various components of the medical instrument 100. In other embodiments the control module 120 may for instance be used to control the various components of a magnetic resonance imaging system and the control module 120 may enable the processor 106 to acquire magnetic resonance data. The computer memory 112 is further shown as containing a database engine 122. The database engine 122 contains code which enables the processor 106 to extract data from the measurement database 116 and construct the measurement vector 114. The database engine 122 may for instance also be useful for forming a statistical analysis to replace missing data or to perform a weighted average of data within the measurement database to construct the measurement vector 114. The computer memory 112 is further shown as containing a trained neural network program 124 that takes the measurement vector 114 as input and outputs the probability 118. The probability 118 is the probability that a gradient coil amplifier will fail within a predetermined number of days in the future.

Figure 2:
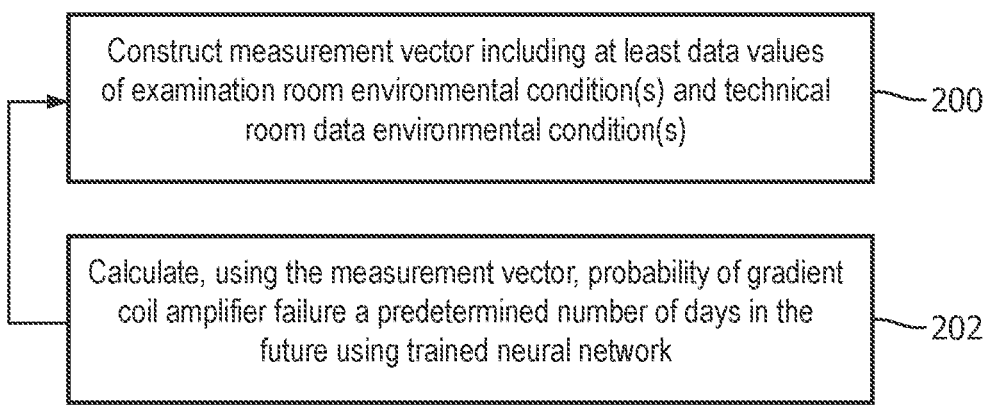
FIG. 2 shows a flow chart illustrating a method of operating the medical instrument of FIG. 1.

FIG. 2 shows a flowchart which illustrates a method of operating the medical apparatus 100 of FIG. 1. Step 200 is to construct a measurement vector 114 which comprises multiple data values using the measurement database 116. The multiple data values comprise examination room data descriptive of the environmental conditions of an examination room of a magnetic resonance imaging system. The multiple data values further comprises technical room data descriptive of the environmental conditions of a technical room of the magnetic resonance imaging system. Next in step 202 a probability 118 of the failure of a gradient coil amplifier of a magnetic resonance imaging system calculated for a predetermined number of days in the future by inputting the measurement vector 114 into the trained neural network program 124. The steps 200 and 202 may be performed repeatedly.

Figure 3:
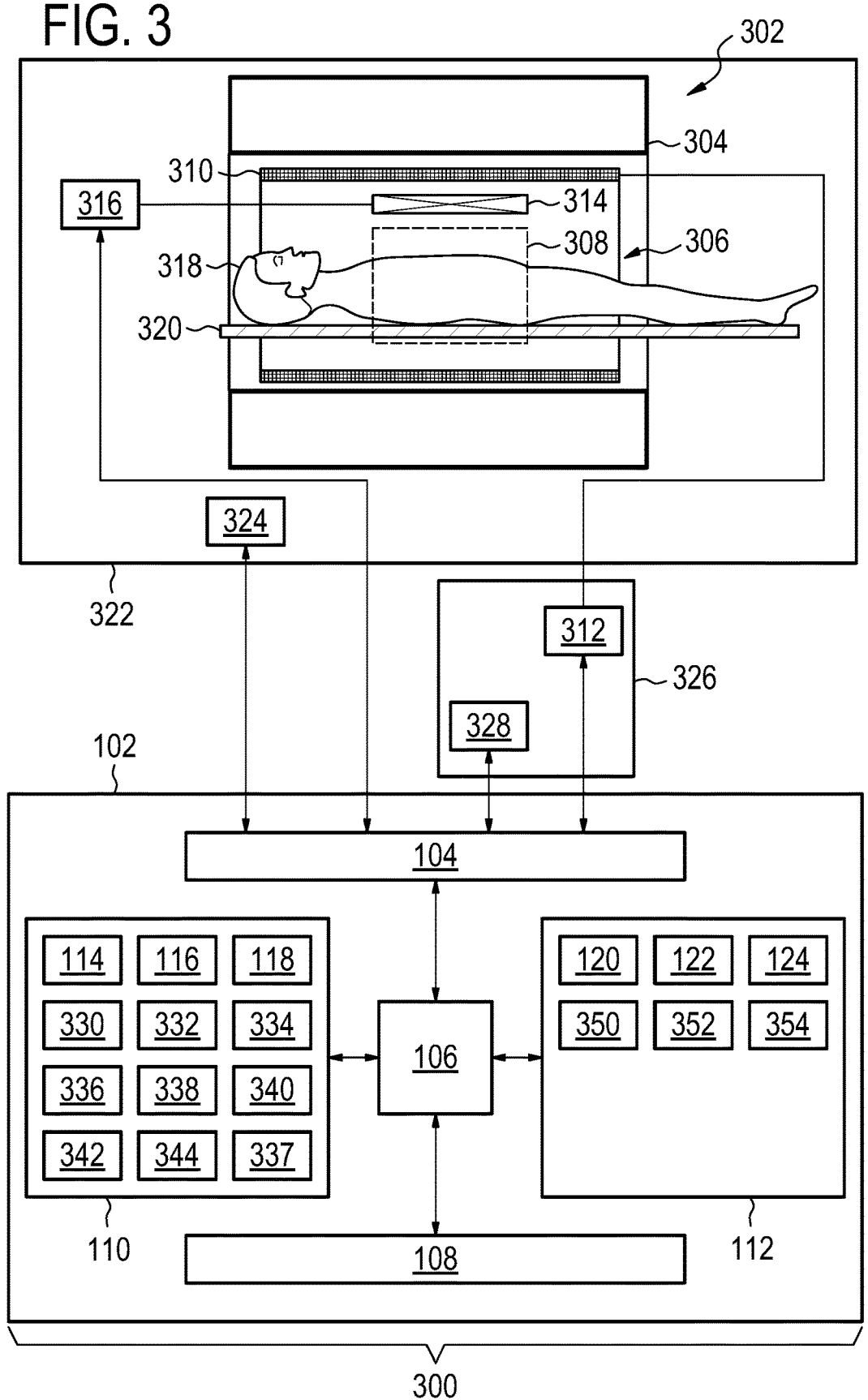
FIG. 3 shows a further example of a medical instrument.

FIG. 3 shows a further example of a medical instrument 300. The medical instrument 300 comprises a magnetic resonance imaging system 302. The magnetic resonance imaging system 302 comprises a magnet 304. The magnet 304 is a superconducting cylindrical type magnet 304 with a bore 306 through it. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 306 of the cylindrical magnet 304 there is an imaging zone 308 where the magnetic field is strong and uniform enough to perform magnetic resonance imaging.

Within the bore 306 of the magnet there is also a set of magnetic field gradient coils 310 which is used for acquisition of magnetic resonance data to spatially encode magnetic spins within the imaging zone 308 of the magnet 304. The magnetic field gradient coils are unshielded magnetic gradient field coils. The magnetic field gradient coils 310 are connected to a gradient coil amplifier 312. The magnetic field gradient coils 310 are intended to be representative. Typically magnetic field gradient coils 310 contain three separate sets of coils for spatially encoding in three orthogonal spatial directions. A magnetic field gradient power supply supplies current to the magnetic field gradient coils. The current supplied to the magnetic field gradient coils 310 is controlled as a function of time and may be ramped or pulsed.

Adjacent to the imaging zone 308 is a radio-frequency coil 314 for manipulating the orientations of magnetic spins within the imaging zone 308 and for receiving radio transmissions from spins also within the imaging zone 308. The radio frequency antenna may contain multiple coil elements. The radio frequency antenna may also be referred to as a channel or antenna. The radio-frequency coil 314 is connected to a radio frequency transceiver 316. The radio-frequency coil 314 and radio frequency transceiver 316 may be replaced by separate transmit and receive coils and a separate transmitter and receiver. It is understood that the radio-frequency coil 314 and the radio frequency transceiver 316 are representative. The radio-frequency coil 314 is intended to also represent a dedicated transmit antenna and a dedicated receive antenna. Likewise the transceiver 316 may also represent a separate transmitter and receivers. The radio-frequency coil 314 may also have multiple receive/transmit elements and the radio frequency transceiver 116 may have multiple receive/transmit channels.

The medical instrument 300 is shown as comprising an examination room 322. The magnet 304 is located within the examination room 322. There is a second set of environmental sensors 324 within the examination room 322. Adjacent to the examination room 322 is a technical room 326. The technical room 326 may contain various components for supplying power, cooling, or other needs for the magnetic resonance imaging system 302. In this example the technical room 326 is shown as containing the gradient coil amplifier 312. There is a first set of environmental sensors 328 within the technical room 326. 3Gradient coil amplifier 312, the receiver 316, the first set of environmental sensor 328, and the second set of environmental sensors 324 are shown as being connected to the hardware interface 104 of the computer 102. The computer 102 in this example is similar to that shown in FIG. 1 but has additional data and/or software components in comparison to that shown in FIG. 1.

The data within the computer storage 110 and/or the programs or instructions within the computer memory 112 are optional in this example. That is to say individual data or instructions may be removed to construct further examples.

The computer storage 110 is shown as containing technical room data 330 acquired using the first set of environmental sensors 328. The computer storage 110 is further shown as containing examination room data 332 acquired using the second set of environmental sensors 324. The computer storage 110 is further shown as containing historical gradient coil amplifier failure database 334. The computer storage 110 is further shown as containing a pulse sequence 336. The pulse sequence 336 may be instructions or data which may be converted into instructions which enable the processor 106 to control the magnetic resonance imaging system 302 to acquire magnetic resonance data 337.

The computer storage 110 is shown as containing magnetic resonance data 337 acquired using the pulse sequence 336. The computer storage 110 is further shown as containing a magnetic resonance image 338 that was reconstructed from the magnetic resonance data 337. The computer storage 110 further contains scan parameter data 340 that was extracted from or derived from the pulse sequence 336 and is descriptive of the usage of the gradient coil amplifier during the acquisition of the magnetic resonance data 337. The computer storage 110 is further shown as containing failed scan data 342. The failed scan data is descriptive of one or more occurrences of failed magnetic resonance image scan by the magnetic resonance imaging system 302. The computer storage 110 is further shown as containing amplifier crash data 344. The amplifier crash data 344 is descriptive of one or more occurrences of a gradient coil amplifier crash by the gradient coil amplifier.

In some examples the database engine 122 may be operable to add one or more of the following to the measurement database 116: the technical room data 330, the examination room data 332, the scan parameter data 340, the failed scan data 342, and the amplifier crash data 344. As such in various examples this data may also be available for constructing the measurement vector 114.

The computer memory 112 is shown as containing an image reconstruction module 350 which enables the processor 106 to reconstruct the magnetic resonance image 338 from the magnetic resonance data 337. The computer memory 112 is further shown as containing a neural network training module 352 that uses the historical gradient coil amplifier failure database 334 to train the trained neural network program 124. The computer memory 112 is further shown as containing the scan parameter data extraction module 354. The scan parameter data extraction module 354 contains code which enables the processor 106 to either directly determine from the pulse sequence 336 or derive it from a model of the scan parameter data 340.

Figure 4:
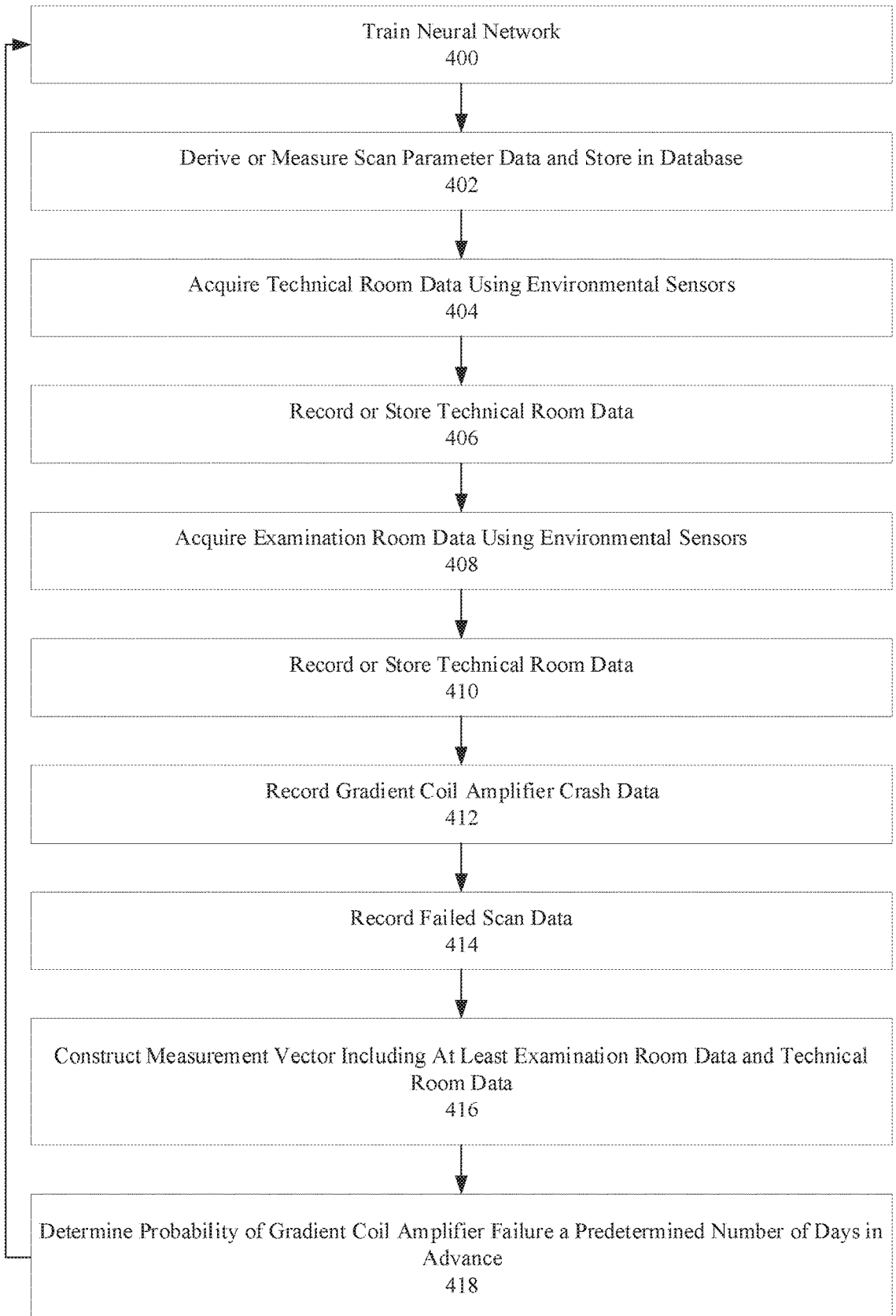
FIG. 4 shows a flow chart illustrating a method of operating the medical instrument of FIG. 3.

FIG. 4 shows a flowchart which shows a method of operating the apparatus of FIG. 3. With the exceptions of steps 416 and 418 the steps described in FIG. 4 may be optional.

First in step 400 the processor 106 trains the trained neural network 124 using the measurement database 116 and/or historical gradient coil amplifier failure database 334. Next in step 402 the scan parameter data 340 is stored in the measurement database 116. This step may also comprise deriving the scan parameter data from the pulse sequence 336 or measuring it during the acquisition of the magnetic resonance data 337. Next in step 404 technical room data 330 is acquired using the first set 328 of environmental sensors. Next in step 406 the technical room data 330 is recorded or stored in the measurement database 116.

Next in step 408 the examination room data 332 is acquired using the second set of environmental sensors 324. In step 410 the examination room data 332 is recorded or stored in the measurement database 116. The measurement vector may comprise technical room data and examination room data extracted from the measurement database 116. Next in step 412 gradient coil amplifier crash data 404 is recorded in the measurement database 116. Next in step 414 failed scan data 342 is recorded in the measurement database. Next in step 416 a measurement vector 114 is constructed from multiple data values using the measurement database. The measurement vector comprises at least the examination room data and the technical room data. In various examples it may also contain the amplifier crash data 344, the failed scan data 342, and/or scan parameter data 340.

Next in step 418 the probability 118 of a failure of the gradient coil amplifier of the magnetic resonance imaging system a predetermined number of days in the future is calculated by inputting the measurement vector 114 into the trained neural network program 124. The acquisition of the magnetic resonance data or prior to the acquisition of the magnetic resonance data the steps 400, 402, 404, 406, 408, 410, 412, 414, 416, and 418 may be repeated. The methods shown in FIG. 2 or 4 may be repeated on a timescale of several times per day, every day or every few days to give advance warning of a gradient coil amplifier failure in the future.

When a failure of a gradient amplifier occurs in an MRI system the measurements from sensors available in and around the gradient amplifier are collected. It is possible that there is no direct known relation between a sensor and possible failures of the component; This may not have an influence on the possible solution. By collecting these measurements from a group of failures, fingerprints of the failures can be detected in the measurement data by using neural network algorithms. When a working gradient amplifier in the field is constantly being monitored by measuring the same sensors and comparing them with the fingerprints from old failures a new failure can be detected before it happens.

A model of a predictor for gradient amplifiers is built by creating failure fingerprints from historical failure data. The data is based on sensors in and around the gradient amplifiers.

Figure 5:
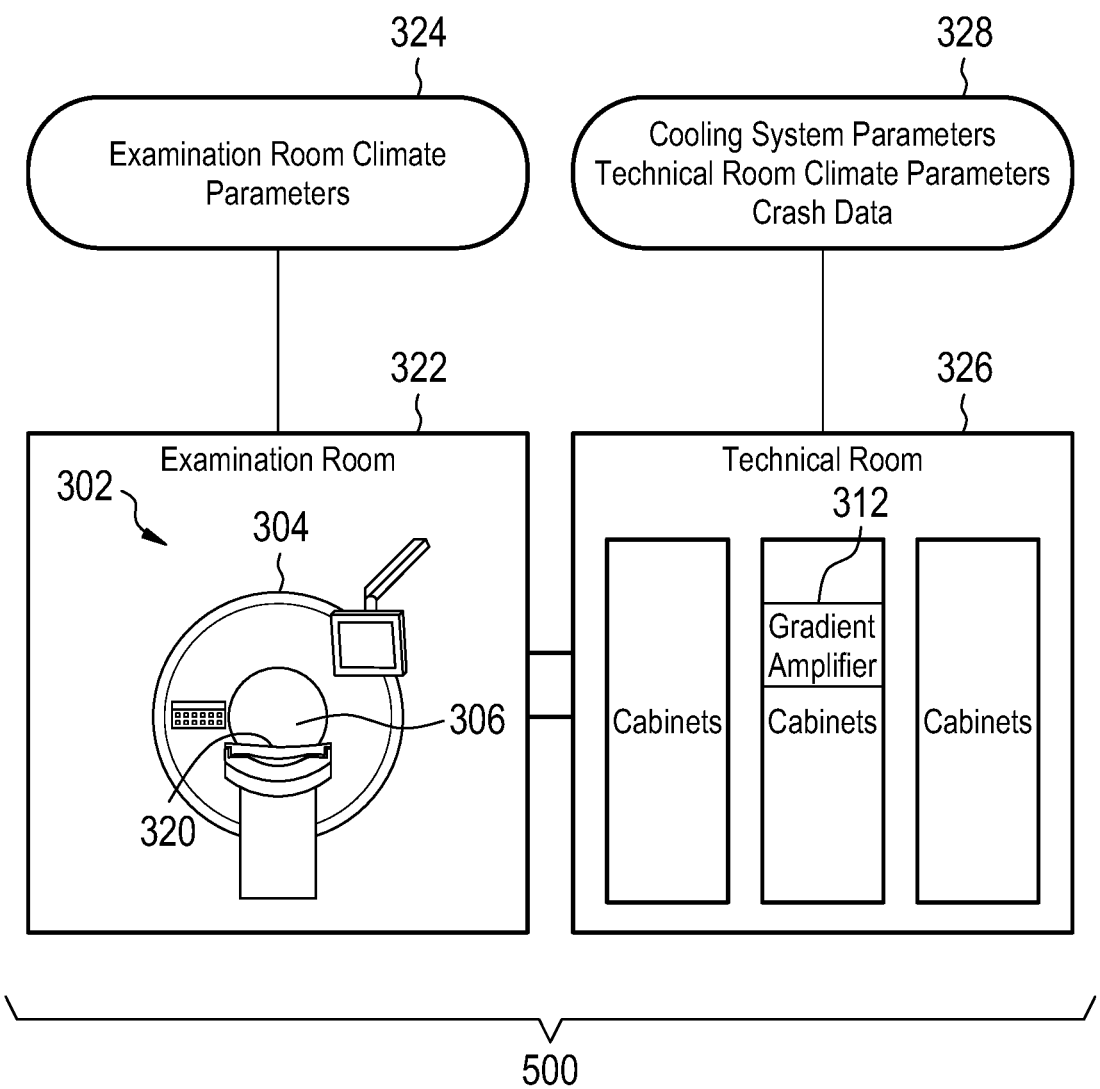
FIG. 5 shows a further example of a medical instrument.

FIG. 5 shows a further example of a medical instrument 500. In this example the magnetic resonance imaging system 302 with a magnet 304 in an examination room 322. There is a technical room with a number of racks of equipment including a gradient amplifier 312. The examination room has a second set of environmental sensors 324 for measuring room climate parameters. The technical room 326 has a first set of environmental sensors 328 for measuring cooling system parameters and technical room climate parameters and also crash data.

A schematic view of the MR system and the relevant sensors is given in FIG. 5. It shows the examination and technical room and the relevant sensors in each room. The gradient amplifier is located in the technical room, but no direct sensors are available on the gradient amplifier. From the technical room there are at least 3 different types of sensors available: climate, cooling system sensors and crash data. The crash data is a sensor which only registers when there is a failed scan or an amplifier crash. An amplifier crash does not mean a broken down amplifier, but merely a 'bug' situation where the gradient amplifier does not operate correctly for a small period of time.

Figure 6:
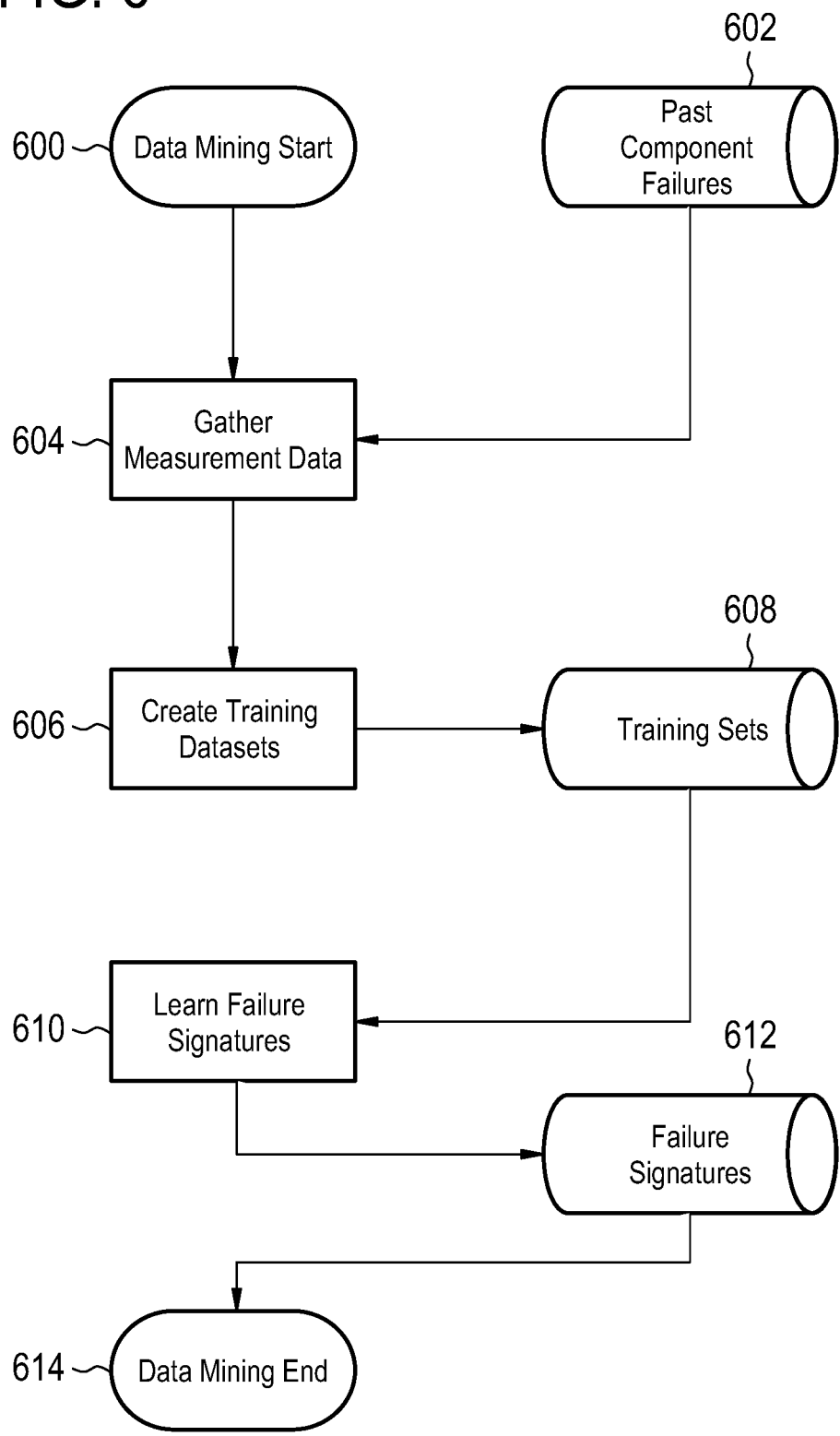
FIG. 6 shows a flow chart illustrating a method.

The examples may comprise two separate steps: A datamining step and a prediction step, both discussed below:

FIG. 6 shows a flowchart which illustrates an example of a method of data mining for training a neural network program to detect or predict failure of a gradient coil amplifier. The method starts in step 600. Then past component failures 602 from the historical database are gathered in step 604 to create datasets for the process. Next in 606 the gathered measurement data is created into training datasets. The training datasets 608 are then input into a neural network training program 610 which trains the neural network program to generate several failure signatures 612. The method ends in step 614.

The data mining procedure is detailed on the right of FIG. 6. It starts by getting timestamps of past component failures 602; Using this information it is possible to get the measurement data of the (relevant) parameters 604. To create fingerprints of failures and to have a system that learns the complex relation between parameters and failures training sets have to be created. A training set is just a collection of rows with the values of the parameters at a certain time and the condition of the component which has to be learned. An example is:

| TTF | p1 | p2 | ... | pn | F |
|---|---|---|---|---|---|
| 10 | 0.059 | 0.736 | ... | 0.68 | 0 |
| 9 | 0.978 | 0.210 | ... | 0.80 | 0 |
| 8 | 0.691 | 0.963 | ... | 0.79 | 0 |
| ... | ... | ... | ... | ... | ... |
| 3 | 0.796 | 0.445 | ... | 0.34 | 1 |
| 2 | 0.588 | 0.754 | ... | 0.12 | 1 |
| 1 | 0.811 | 0.844 | ... | 0.80 | 1 |

The first column describes the Time To Failure, which can be in hours/days/seconds, depending on the application. The parameters p1 ... pn are shown in the table and the condition of the component is shown in the last column, denoted by F. A value of 0 means that everything was still OK and a value of 1 means that the system will fail within x days/hours/second. The value of x is dependent on the application. A high value is desirable but can prove to be difficult. In step 610 the training sets from 608 are analyzed using a learning algorithm. The learning algorithm is a function such as:

$$f(p_1 \ldots p_n) = F(0/1).$$

In this case a Neural Network program is used. When there is a high accuracy of the model the learning algorithm parameters are stored 612 and the data mining procedure is finalized.

Using the failure signatures it is possible to predict whether or not a gradient amplifier will fail, by creating the predictor model using the learning model parameters from 612 and feeding live values from the same sensors into the model. If the model reports a 1 the component will fail with high certainty in x days (a predetermined number of days), otherwise the component is working correctly.

A test was performed by measuring data from 78 different failures of gradient amplifier and with an x of 5 days. The results show a 75% accuracy in predicting the failures and 2% false positives.

FIG. 7 shows an example of a table. The table 700 shows a number of measurement vectors 700 for different time periods 702. The probability 706 calculated from each of the measurement vectors 700 is also displayed in the table. The measurement vector 700 is comprised of a number of different data values 704. Every time the neural network evaluates the output 700 of the network based on the inputs 704 it outputs a value between 0 and 1 which is the probability 706. This is the probability that the gradient amplifier will fail within a predetermined number of days. For instance the probability that the amplifier could fail within the next 24 hours. In the example shown in FIG. 7 the evaluation only evaluates data on the particular row so essentially there is no trending of the data which is examined.

FIG. 8 shows an alternative table. The table in FIG. 8 illustrates a method of doing trending with data that is input into a neural network. There is again a measurement vector 700 that is constructed for different time periods 702. However in this case extra inputs are created by shifting inputs from other times. In this example the X1 input is used to create three additional inputs effectively providing the neural network with additional historical data to create relations between.

The input to a neural network can also be modified to average inputs. In examining the tables the neural network evaluates every row or measurement vector. Each row of the table or measurement vector is a time instance and this means a fixed sampling rate for all the inputs. However, not all data is input at the same sample rate. For instance the temperature humidity might be measured one time per day. The gradient amplifier switching may for instance be measured 20,000 times per scan. It may be beneficial to find a way of harmonizing the different sampling rates to create an equal sample rate. This for instance may be achieved by performing a weighted averaging. This may be done by windowing every parameter for the required sampling rate needed for the solution. In this example for instance it may be 24 hours.

Figure 9:
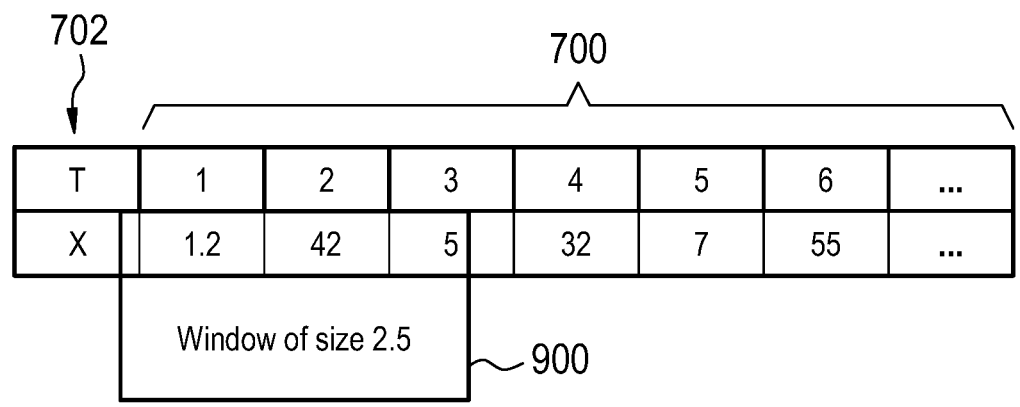
FIG. 9 illustrates a method of calculating a weighted average.

FIG. 9 shows a table illustrating a measurement vector 700 for the time period X 702. The data is averaged over the window 900. In this example the window is 2.5 times the size of a particular data value. This results in a window value of X of:

$$Xw=(1.0*1.2+1.0*42+0.5*5)/2.5=18.28$$

Figure 10:
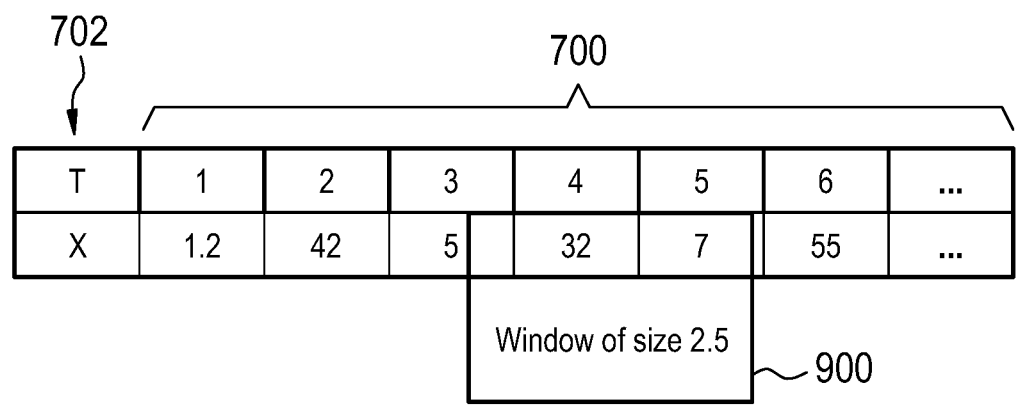
FIG. 10 further illustrates the method of calculating a weighted average.

FIG. 10 shows a window time sample for the time period immediately after the time period shown in FIG. 9. In this example, again the time period is 2.5 times the size of a particular data value and this results in a window value of X of:

$$Xw=(0.5*5+1.0*32+1.0*7)/2.5=16.6.$$

Doing the method of averaging may provide for a harmonized input set or measurement vector for using in the trained neural network program. This may be done for every input for the required time window. The time window size may be dependent upon a particular application. This may be beneficial because it may result in a harmonized input set or a given window size or time for the neural network where every input is sampled equally.

There is a relation between the usage (hours) of an MRI and the amount of gradient amplifier failures. A relation can be found between usage of the MRI and the amount of usage of a gradient amplifier. This is heavily protocol dependent and a long scan doesn't automatically mean a high gradient amplifier usage.

This can be expressed in the formula:

$$P(F)=f(X1,X2,X3 \ldots ,Xn,U1,U2, \ldots Un)$$

P(F) is the chance a gradient amplifier will fail within the next 24 hours

X1 ... Xn are environmental parameters (e.g. humidity, temperature)

U1, U2, ... Un are usage parameters

Regarding the gradient amplifier there are several important usage parameters:

Switching times per scan (in case of dual configuration)
Energy consumption per scan
Total scan time
RMS of current per scan Different scan protocol require different amount of energies and scan times resulting in more or less usage of a gradient amplifier While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 medical instrument
102 computer
104 hardware interface (optional)
106 processor
108 user interface
110 computer storage
112 computer memory
114 measurement vector
116 measurement database
118 probability
120 control module
122 database engine
124 trained neural network program
300 medical instrument
302 magnetic resonance imaging system
304 magnet
306 bore of magnet
308 imaging zone
310 magnetic field gradient coils
312 gradient coil amplifier
314 radio-frequency coil
316 transceiver
318 subject
320 subject support
322 examination room
324 second set of environmental sensors
326 technical room
328 first set of environmental sensors
330 technical room data
332 examination room data
334 historical gradient coil amplifier failure database
336 pulse sequence
337 magnetic resonance data
338 magnetic resonance image
340 scan parameter data
342 failed scan data
344 amplifier crash data
350 image reconstruction module
352 neural network training module
354 scan parameter data extraction module
500 medical instrument
700 measurement vector
702 time period
704 data values
706 probability
900 window

The invention claimed is:

1. A medical instrument comprising:
a memory for storing machine executable instructions;
a processor, wherein execution of the machine executable instructions causes the processor to repeatedly:
construct, using a measurement database, a measurement vector comprising multiple data values including examination room data descriptive of environmental conditions of an examination room of a magnetic resonance imaging system and technical room data descriptive of environmental conditions of a technical room of the magnetic resonance imaging system; and
generating a prediction of failure of a gradient coil amplifier of the magnetic resonance imaging system a predetermined number of days in advance by inputting the measurement vector into a trained neural network program to detect fingerprints of failures from the measurement vector.

2. The medical instrument of claim 1, wherein the medical instrument further comprises the magnetic resonance imaging system, wherein the technical room contains the gradient coil amplifier, wherein the examination room comprises a main magnet of the magnetic resonance imaging system, wherein the technical room comprises a first set of environmental sensors for measuring the technical room data, wherein the examination room further comprises a second set of environmental sensors for measuring the examination room data, wherein execution of the instructions further cause the processor to repeatedly:
acquire the technical room data using the first set of environmental sensors;
record the technical room data in the measurement database;
acquire the examination room data using the second set of environmental sensors; and
record the examination room data in the measurement database.

3. The medical instrument of claim 1, wherein execution of the instructions causes the processor to train the trained neural network using the measurement database, a historical gradient coil amplifier failure database, or both the measurement database and the historical gradient coil amplifier failure database.

4. The medical instrument of claim 1, wherein execution of the instructions further causes the processor to store scan parameter data in the measurement database, wherein the scan parameter data is descriptive of the usage of gradient coil amplifier during acquisition of magnetic resonance data, wherein the measurement vector further comprises the scan parameter data.

5. The medical instrument of claim 4, wherein the scan parameter data comprises any one of the following: number of gradient coil amplifier switching operating, total scan time, average RMS current per scan, peak RMS current per scan, scan protocol, and combinations thereof.

6. The medical instrument of claim 1, wherein execution of the instructions causes the processor to construct the measurement vector for a predetermined measurement period.

7. The medical instrument of claim 6, wherein at least one of the multiple data values is descriptive of a measurement value for a specific measurement period different than the predetermined measurement period, wherein execution of the instructions causes the processor to harmonize sampling rates associated with the measurement periods by constructing the least one of the multiple data values by calculating a weighted average.

8. The medical instrument of claim 7, wherein execution of the instructions causes the processor to construct at least one of the multiple data values by retrieving previous data from the measurement database for a time period that occurred before the specific measurement period.

9. The medical instrument of claim 1, wherein execution of the instructions further causes the processor to repeatedly:

record failed scan data in the measurement database, wherein the failed scan data is descriptive of one or more occurrence of a failed magnetic resonance image scan by the magnetic resonance imaging system, wherein the measurement vector further comprises the failed scan data in the measurement database, recorded gradient coil amplifier crash data in the measurement database, or both the failed scan data and the recorded gradient coil amplifier crash data in the measurement database, wherein the gradient coil amplifier crash data is descriptive of one or more occurrence of a gradient coil amplifier crash by the gradient coil amplifier, wherein the measurement vector further comprises the gradient coil amplifier crash data.

10. The medical instrument of claim 1, wherein examination room data comprises any one of the following: examination room temperature, examination room humidity, and combinations thereof.

11. The medical instrument of claim 1, wherein the technical room data comprises any one of the following: technical room temperature, technical room humidity, gradient coil amplifier coolant temperature, gradient coil amplifier coolant pressure, gradient foil amplifier coolant flow rate, and combinations thereof.

12. The medical instrument of claim 1, wherein the predetermined number of days is any one of the following: 1 day, 2 days, 3 days, 4 days, 5 days, 6 days, 7 days, greater than 3 days, greater than 4 days, greater than 5 days, greater than 6 days, and greater than 7 days.

13. A computer program product comprising machine executable instructions for execution by a processor controlling a medical instrument, wherein execution of the machine executable instructions cause the processor to repeatedly:
   construct, using a measurement database, a measurement vector comprising multiple data values including examination room data descriptive of environmental conditions of an examination room of a magnetic resonance imaging system and technical room data descriptive of environmental conditions of a technical room of the magnetic resonance imaging system;
   generating a prediction that warns of failure of a gradient coil amplifier of the magnetic resonance imaging system a predetermined number of days in advance by inputting the measurement vector into a trained neural network program.

14. A method of operating a medical instrument, wherein the method comprises repeatedly:
   constructing, using a measurement database, a measurement vector comprising multiple data values including examination room data descriptive of environmental conditions of an examination room of a magnetic resonance imaging system and technical room data descriptive of environmental conditions of a technical room of the magnetic resonance imaging system; and
   generating a prediction that warns of failure of a gradient coil amplifier of the magnetic resonance imaging system a predetermined number of days in advance by inputting the measurement vector into a trained neural network program.

* * * * *